(12) United States Patent
Hiyoshi

(10) Patent No.: US 6,770,964 B2
(45) Date of Patent: Aug. 3, 2004

(54) SEMICONDUCTOR DEVICE INCLUDING INTERMEDIATE WIRING ELEMENT

(75) Inventor: Michiaki Hiyoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/953,295

(22) Filed: Sep. 17, 2001

(65) Prior Publication Data

US 2002/0038873 A1 Apr. 4, 2002

(30) Foreign Application Priority Data

Sep. 29, 2000 (JP) .................................... 2000-301068

(51) Int. Cl.[7] ............................................ H01L 23/48
(52) U.S. Cl. ..................... 257/692; 257/690; 257/693; 257/723; 257/778; 257/784
(58) Field of Search ................... 257/578, 621, 257/622, 690, 691, 692, 693, 694, 718, 719, 723, 724, 725, 726, 778, 782, 784, 727; 438/411, 617

(56) References Cited

U.S. PATENT DOCUMENTS

| | | | | |
|---|---|---|---|---|
| 4,783,695 A | * | 11/1988 | Eichelberger et al. | 257/668 |
| 5,103,290 A | * | 4/1992 | Temple et al. | 257/698 |
| 5,291,065 A | * | 3/1994 | Arai et al. | 257/723 |
| 5,559,363 A | * | 9/1996 | Immorlica, Jr. | 257/725 |
| 5,616,955 A | * | 4/1997 | Yamada et al. | 257/690 |
| 5,637,922 A | * | 6/1997 | Fillion et al. | 257/728 |
| 5,648,679 A | * | 7/1997 | Chillara et al. | 257/666 |
| 5,942,797 A | * | 8/1999 | Terasawa | 257/723 |
| 6,060,772 A | * | 5/2000 | Sugawar et al. | 257/678 |
| 6,166,937 A | * | 12/2000 | Yamamura et al. | 257/723 |
| 6,271,601 B1 | * | 8/2001 | Yamamoto et al. | 257/784 |
| 2001/0013654 A1 | * | 8/2001 | Kalidas et al. | 257/738 |

* cited by examiner

Primary Examiner—Eddie Lee
Assistant Examiner—Quang Vu
(74) Attorney, Agent, or Firm—Oblon, Spivak, McClelland, Maier & Neustadt, P.C.

(57) ABSTRACT

An IGBT module comprises a ceramic substrate having a collector wiring element on a surface thereof, an IGBT chip provided on the collector wiring element, an insulative member provided on the collector wiring element and configured to cover at least edge portions of the IGBT chip, and an insulative sealing resin, provided on the ceramic substrate, for covering the IGBT chip and the insulative member. The sealing resin has lower insulation properties than the insulative member.

16 Claims, 10 Drawing Sheets

SEMICONDUCTOR DEVICE INCLUDING INTERMEDIATE WIRING ELEMENT

CROSS-REFERENCE TO RELATED APPLICATIONS

This application is based upon and claims the benefit of priority from the prior Japanese Patent Application No. 2000-301068, filed Sep. 29, 2000, the entire contents of which are incorporated herein by reference.

BACKGROUND OF THE INVENTION

1. Field of the Invention

The present invention relates generally to semiconductor devices, and more particularly to a semiconductor device for use in an industrial or a railway power converter apparatus, such as an IGBT (Insulated Gate Bipolar Transistor) module to be used with a large current and a high voltage.

2. Description of the Related Art

FIG. 1 is a cross-sectional view of a prior-art IGBT module

An IGBT module 10, as shown in FIG. 1, comprises a base plate 11, a ceramic substrate 12, an IGBT chip 13, an emitter terminal 14-1, a collector terminal 14-2, a gate terminal 14-3, a resin case 15, and a resin cap 16.

A copper plate 17 is provided on a back face of the insulative ceramic substrate 12. The copper plate 17 is attached to the base plate 11 by means of a solder 18. The ceramic substrate 12 has copper plates 19-1 to 19-3 on its upper surface, which serve as emitter, collector and gate wiring elements, respectively.

A lower surface (i.e. a semiconductor substrate surface; a collector region formation surface) of the IGBT chip 13 is attached to the collector wiring element 19-2 by means of a solder 18. An emitter region present on an upper surface of the IGBT chip 13 is connected to the emitter wiring element 19-1 by means of a bonding wire 20. In addition, a gate region present on the upper surface of the IGBT chip 13 is connected to a gate resistor 21 by means of a bonding wire 20. The gate resistor 21 is bonded to the gate wiring element 19-3 by means of a solder 18.

The emitter, collector and gate terminals 14-1 to 14-3 are bonded to the emitter, collector and gate wiring elements 19-1 to 19-3 by means of solders 18.

The base plate 11 is put in the resin case 15. The upper portion of the resin case 15 is sealed by the resin cap 16. A resin 22 is filled in the space defined by the resin case 15 and resin cap 16.

FIG. 2A is a plan view of a prior-art IGBT module with a plurality of IGBT chips.

An emitter wiring element 19-1, as shown in FIG. 2A, has a T-shape and is provided on a central region of the ceramic substrate 12. A collector wiring element 19-2 is provided on the ceramic substrate so as to surround the emitter wiring element 19-1. Gate wiring elements 19-3 are provided on outer peripheral regions of the emitter wiring element 19-2. Emitter sense wiring elements 19-4 are provided on the ceramic substrate 12, adjacent to the gate wiring elements 19-3.

On the collector wiring element 19-2, four IGBT chips 13-1 to 13-4 and two FRD (Fast Recovery Diode) chips 23-1 and 23-2 are provided. Emitter/gate regions of the IGBT chips 13-1 to 13-4 are connected to the emitter/gate wiring elements 19-1 and 19-3 by means of bonding wires 20. The FRD chips 23-1 and 23-2 have their lower surfaces (semiconductor substrate surfaces; cathode regions) bonded to the collector wiring element 19-2, and have their upper surfaces (anode regions) connected to the emitter wiring element 19-1 by means of bonding wires 20. Emitter and collector terminals 14-1 and 14-2 are provided on regions ET and CT of the emitter and collector wiring elements 19-1 and 19-2, respectively.

FIG. 2B is a plan view of another prior-art IGBT module with a plurality of IGBT chips. In the structure shown in FIG. 2B, the lengths of current paths between the collector terminal 14-2 and emitter terminal 14-1 are made uniform for the respective IGBT chips.

In FIG. 2B, compared to FIG. 2A, the current paths between the emitter regions of the IGBT chips 13-3 and 13-4 chips and the emitter terminal are made longer. Thereby, the current path lengths between the IGBT chips 13-1 to 13-4 and the emitter terminal are made uniform, and the parasitic inductance, which is parasitically present in the current paths, is made uniform.

BRIEF SUMMARY OF THE INVENTION

A semiconductor device comprising:
- an insulative substrate having a first wiring element on a surface thereof;
- a semiconductor chip provided on the first wiring element;
- an insulative resin provided on the first wiring element and covering at least edge portions of the semiconductor chip, and
- an insulative sealing member, provided on the insulative substrate, for covering the semiconductor chip and the insulative member, the sealing member having lower insulation properties than a region of the insulative member, which is in contact with the semiconductor chip and the first wiring element.

DETAILED DESCRIPTION OF THE INVENTION

Figure 3:
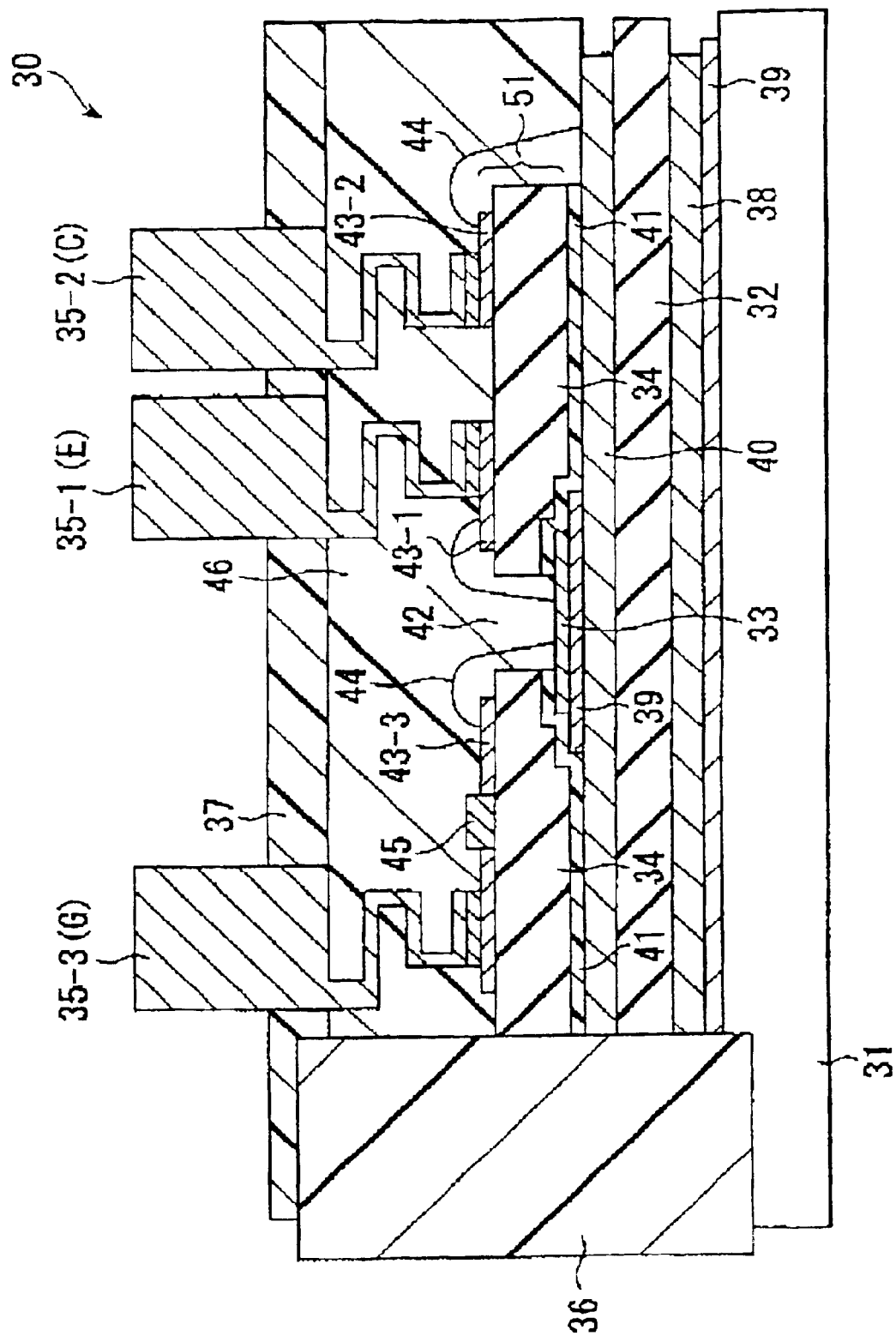
FIG. 3 is a cross-sectional view of an IGBT module according to a first embodiment of the present invention.

FIG. 3 is a cross-sectional view of an IGBT module according to a first embodiment of the present invention.

An IGBT module 30, as shown in FIG. 3, comprises a base plate 31, a ceramic substrate 32, an IGBT chip 33, an intermediate wiring element 51, an emitter terminal 35-1, a collector terminal 35-2, a gate terminal 35-3, a resin case 36, and a resin cap 37.

A copper plate 38 is provided on a back face of the insulative ceramic substrate 32. The copper plate 38 is attached to the base plate 31 by means of a solder 39. The ceramic substrate 32 has a copper plate 40 on its upper surface, which serves as a collector wiring element.

A lower surface i.e. a semiconductor substrate surface; a collector region formation surface) of the IGBT chip 33 is attached to the collector wiring element 40 by means of a solder 39.

The intermediate wiring element 51 comprises insulative members 34 and copper plates 43-1 to 43-3 provided on the insulative members 34. The copper plates 43-1 to 43-3 function as emitter/collector/gate wiring elements. The intermediate wiring element 51 is bonded to the collector wiring element 40 by means of a high-insulation resin 41. The intermediate wiring element 51 has an opening 42, through which the surface of the IGBT chip 33 is exposed. Emitter and gate regions provided on the surface of the IGBT chip 33 are connected via the opening 42 to the emitter and gate wiring elements 43-1 and 43-3 by means of bonding wires 44 of Al (aluminum), etc. That portion of the collector wiring element 40, which does not overlap the intermediate wiring element 51, is connected to the collector wiring element 43-2 by means of a bonding wire 44. A gate resistor 45 is provided on the gate wiring element 43-3.

Emitter/collector/gate terminals 35-1 to 35-3 are provided on the emitter/collector/gate wiring elements 43-1 to 43-3. Both are bonded by means of solders 39.

The base plate 31 is put in the resin case 36. The upper portion of the resin case 36 is sealed by the resin cap 37. A resin 46 is filled in the space defined by the resin case 36 and resin cap 37.

The IGBT module with the above structure has the following advantages;

(1) Assembly steps of the IGBT module are simplified,
(2) The degree of freedom of layout in plan of the IGBT module is enhanced, and
(3) The breakdown voltage of the IGBT module is increased.

The advantage (1) will now he explained with reference to FIGS. 4A and 4B.

Figure 4A:
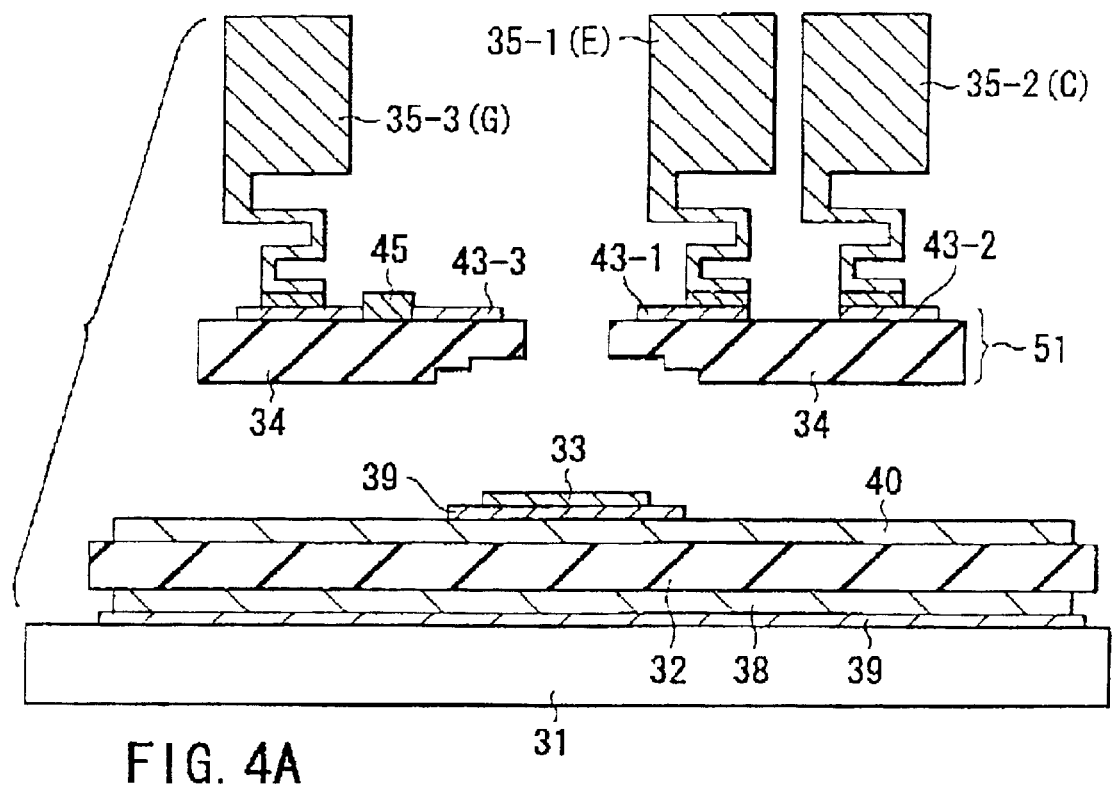
FIGS. 4A and 4B are cross-sectional views illustrating in succession the steps of fabricating the IGBT module according to the first embodiment.
Figure 4B:
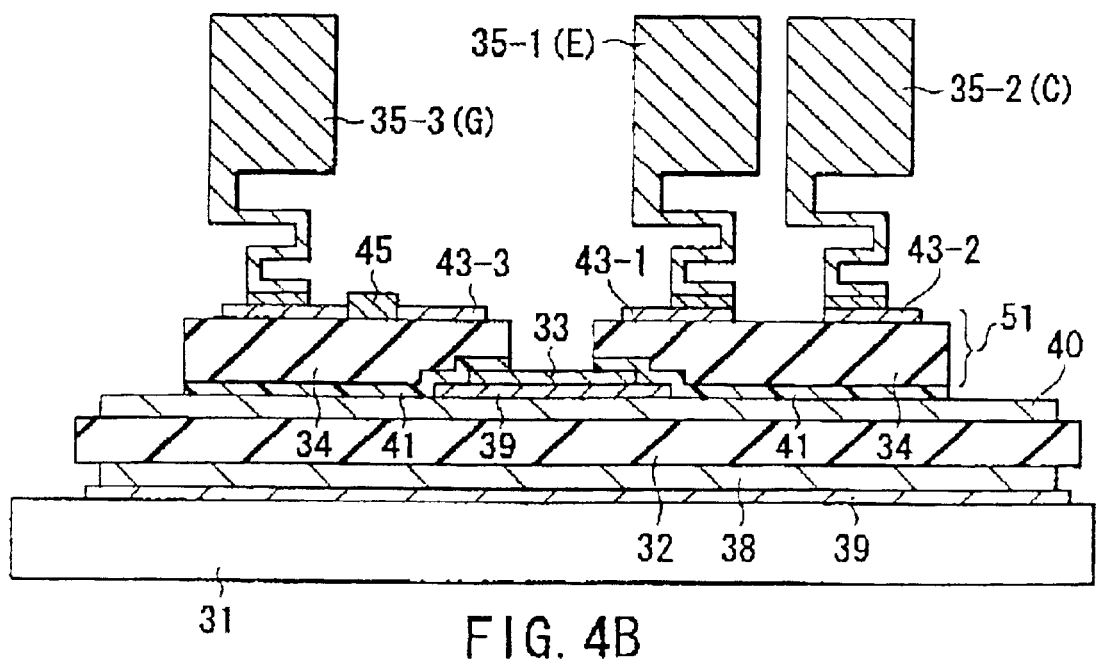

FIGS. 4A and 4B are cross-sectional views illustrating in succession the steps of assembling the IGBT module. The IGBT module according to this embodiment is assembled in the following manner.

To start with, the IGBT chip 33 is bonded by means of high-melting-point solder 39 to the ceramic substrate 32 having copper plates 38 and 40, as shown in FIG. 4A. The ceramic substrate 32 is attached to the base plate by means of low-melting-point solder 39. Aside from these steps, the intermediate wiring element 51 is prepared wherein the emitter/collector/gate terminals 35-1 to 35-3 are bonded to the emitter/collector/gate wiring elements 43-1 to 43-3 by means of low-melting-point solder 39.

As is shown in FIG. 4B, the intermediate wiring element 51 is bonded to the collector wiring element 40 by means of high-insulation resin 41. In this case, the high-insulation resin 41 covers edge portions of the IGBT chip 33.

Subsequently, as shown in FIG. 3, wire bonding is effected between the emitter/gate regions on the IGBT chip 33 and the emitter/gate wiring elements 43-1 and 43-3 and between the collector wiring element 40 and the collector wiring element 43-2. The base plate 31 is put in the resin case 36. The resin 46 having lower insulation properties than the high-insulation resin 41 is filled in the resin case 36. Finally, the resultant structure is sealed by the resin cap 37 and the IGBT module 30 is fabricated.

The IGBT module 30 according to the present embodiment is assembled through the above-described assembly steps. Specifically, each terminal, 35-1 to 35-3, is not directly bonded to the ceramic substrate 32 by solder. Instead, the intermediate wiring element 51, to which the terminals 35-1 to 35-3 are bonded by solder, is attached to the ceramic substrate 32 by meant of resin 41. This point will now be explained in comparison with the prior art.

According to the prior-art structure, each terminal, 35-1 to 35-3, is directly bonded to the ceramic substrate 32 by low-melting-point solder. It is thus necessary to simultaneously perform the "step of bonding the ceramic substrate 32 to the base plate 31 by solder" and the "step of bonding each terminal, 35-1 to 35-3, to the ceramic substrate 32 by solder." In the prior art, it is difficult to automatically carry out these two steps. In addition, these steps are complex and difficult, requiring a great deal of time and labor.

By contrast, in the present embodiment, no solder is needed in bonding the intermediate wiring element 51 that is integrally formed with the terminals 35-1 to 35-3. In addition, the terminals 35-1 to 35-3 are bonded to the intermediate wiring element 51 in a step different from the main assembly process. This step can easily be automated. In short, unlike the prior art, there is no need to simultaneously perform the bonding of the terminals and the solder-bonding between the base plate 31 and ceramic substrate 32. It is thus possible to automate the step of mounting the ceramic substrate 32 on the base plate 31. Accordingly, all the steps of mounting the ceramic substrate 32, intermediate wiring element 51 and each terminal, 35-1 to 35-3, can be automated. Therefore, the assembly steps of the IGBT module can be greatly simplified, the amount of required time and labor reduced, and the yield enhanced.

The advantage (2) will now be explained. In the prior-art structure, the emitter/collector/gate wiring elements are formed through the following steps:

Mounting of a copper plate on a ceramic substrate, and
Patterning of the copper plate.

Accordingly, three wiring elements, i.e. the emitter/collector/gate wiring elements, are present on the same plane. In addition, insulation has to be maintained between the respective wiring elements. Thus, when the copper plate is to be patterned, an adequate distance needs to be provided between the respective wiring elements. Needless to say, as the rated power of the IGBT chip increases, a larger distance needs to be provided between the wiring elements. For these reasons, the IGBT module with the prior-art structure has a low area efficiency, and the degree of freedom of layout of the respective terminals is strictly limited. On the other hand, if the degree of freedom of layout of the respective terminals is to be increased, the IGBT chip capable of being mounted in the IGBT module is limited to a small-sized one.

The IGBT module according to this embodiment, however, uses the intermediate wiring element 51, and thus the area efficiency of the IGBT module can be improved. In addition, the degree of freedom of layout in plan can be increased. The reasons will now be stated.

Figure 1:
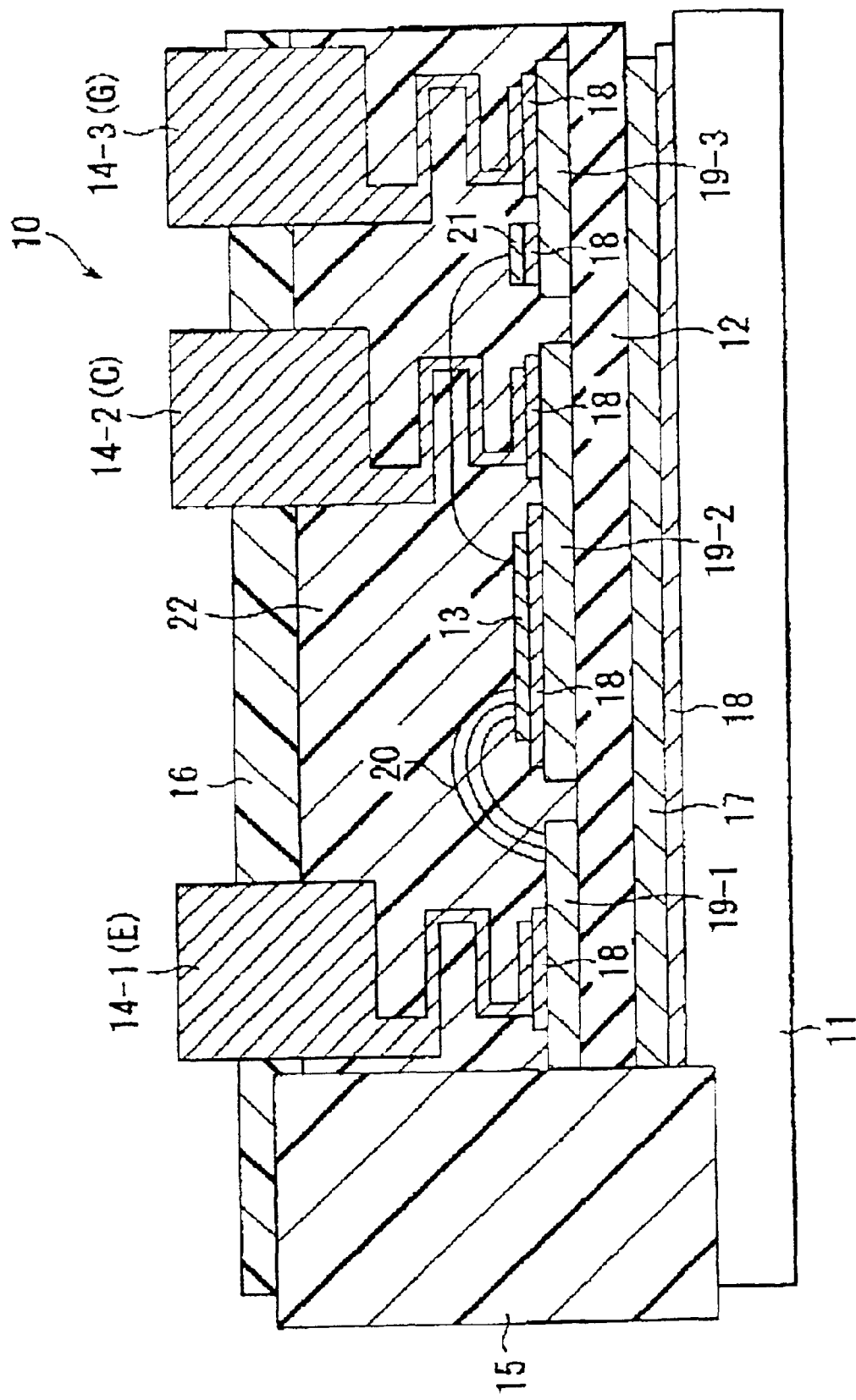
FIG. 1 is a cross-sectional view of a prior-art IGBT module.

In the case of the IGBT module with the prior-art structure, the collector terminal has to be provided on the copper plate to which the IGBT chip is bonded. In other words, the collector terminal has to be provided adjacent to the IGBT chip (see FIG. 1).

In the IGBT module of the present embodiment, however, the copper plate 40 serving as the collector wiring element is provided on the ceramic substrate 32, and the intermediate wiring element 51 with the emitter/collector/gate wiring elements 43-1 to 43-3 is provided on the copper plate 40. The respective terminals 35-1 to 35-3 are provided on the emitter/collector/gate wiring elements 43-1 to 43-3 of intermediate wiring element 51. The collector wiring element 43-2 provided with the collector terminal 35-2 is connected to the collector wiring element 40 on the ceramic substrate 32.

Accordingly, the collector wiring element 43-2 may be provided anywhere on the insulative members 34. In other words, the collector wiring element 43-2 may provided on an empty area on the insulative members 34, which is created after the emitter and gate wiring elements 43-1 and 43-3 are desiredly formed by patterning. For example, in FIG. 3, the collector wiring element 43-2 is provided adjacent to the emitter wiring element 43-1 but it may be provided adjacent to the gate wiring element 43-3. In this case, an opening reaching the collector wiring 40 is newly formed in the intermediate wiring element 51, and the collector wiring element 40 and collector wiring element 43-2 are wire-banded via this opening. According to the structure of this embodiment, the location of each terminal is not limited.

In the structure according to the present embodiment, the formation area of each wiring element is larger than in the prior art. Since there is no need to mount the IGBT chip on the collector wiring element 43-2, the collector wiring element may have only an area necessary for mounting the collector terminal 35-2. Furthermore, the emitter/collector/gate wiring elements 43-1 to 43-3, on which the respective terminals are mounted, and the collector wiring element 40, on which the IGBT chip 33 is mounted, are present in different planes. Accordingly, the region where the respective wiring elements 43-1 to 43-3 can be provided corresponds to the region on the surface of the ceramic substrate 32, from which the bonding area with the collector wiring element 40 and the bonding areas on the IGBT chip 33 with the emitter/gate regions are excluded. Besides, part of the intermediate wiring element 51 overlaps the edge portions of the IGBT chip 33. It is thus possible to use the overlapping regions as the regions where the wiring elements 43-1 to 43-3, on which the respective terminals are disposed, are to be provided. Moreover, since the IGBT chip 33 and the respective wiring elements 43-1 to 43-3 are provided in different planes, there is no need to consider insulation therebetween. As a result, the area where the wiring elements 43-1 to 43-3 are to be provided can be made much larger than in the prior art.

As has been explained above, the degree of freedom of layout in plan of the IGBT module can be increased because the location of each terminal is not limited and the area for formation of each wiring element is increased.

The advantage (3) will now be explained. In the prior-art IGBT module, silicone gel is used as a sealing resin. The reason is that silicone gel has high softness. The high softness of the resin can prevent thermal stress from applying to the bonding wires, when a quick temperature variation has occurred in the IGBT module.

A breakdown voltage of 4500V or more is required in modern IGBT modules. In general terms, the higher the insulation properties of a resin, the lower the softness. On the other hand, the lower the insulation properties, the higher the softness. The silicone gel is a resin with high softness. Since the silicone gel has a great number of pores, the silicone gel has a low volume resistance. In addition, Since gel cracks may easily form, the silicone gel has low insulation properties. Moreover, the insulation properties of the silicon gel deteriorate due to moisture absorption. With the IGBT module of the prior-art structure using the silicone gel, it is very difficult to achieve the above-mentioned breakdown voltage of 4500V or more.

From the standpoint of achievement of higher breakdown voltages, it is preferable to use a resin having higher insulation properties than the silicone gel, such as an epoxy resin, a polyimide resin or a hardening type silicone resin, as a sealing resin for the IGBT module. However, a resin with high insulation properties has high hardness, as mentioned above. If such a resin is used to seal the IGBT module, thermal stress may apply to the bonding wires. The thermal stress may break the bonding wires. Under the circumstances, the IGBT module with the prior-art structure uses the resin (silicone gel) having high softness and low insulation properties, thus preventing thermal stress, while sacrificing breakdown voltage.

By contrast, according to the IGBT module of the present embodiment, thermal stress on bonding wires can be prevented and a breakdown voltage of 4500V or more is realized. In general terms, in semiconductor chips including IGBT chips, an electric field concentrates on an edge portion, in particular, a corner portion. In other words, an electric field does not particularly concentrate on portions other than edge portions. This makes it possible to use a resin with low insulation properties and high softness at regions contacting portions other than edge portions of the IGBT chip 33. Accordingly, if breakdown of insulation at edge portions of the IGBT chip is prevented, the breakdown voltage of the IGBT module can be increased.

In the IGBT module of this embodiment, the edge portions of the IGBT chip 33 are covered with the high-insulation resin 41. This permits use of a soft resin such as silicone gel to be filled in the resin case 36. Thereby, the breakdown voltage of the IGBT module 30 can be increased and thermal stress on bonding wires can be prevented. If thermal stress on bonding wires is prevented, the reliability of the IGBT module is enhanced.

In the IGBT module of this embodiment, the high-insulation resin 41 is used to insulate the IGBT chip 33. However, if a high-insulation material is used for the insulative members 34 that are parts of the intermediate wiring element 51, the high-insulation resin 41 is not necessarily required. In this case, the insulative members 34 function like the high-insulation resin 41.

Figure 5:
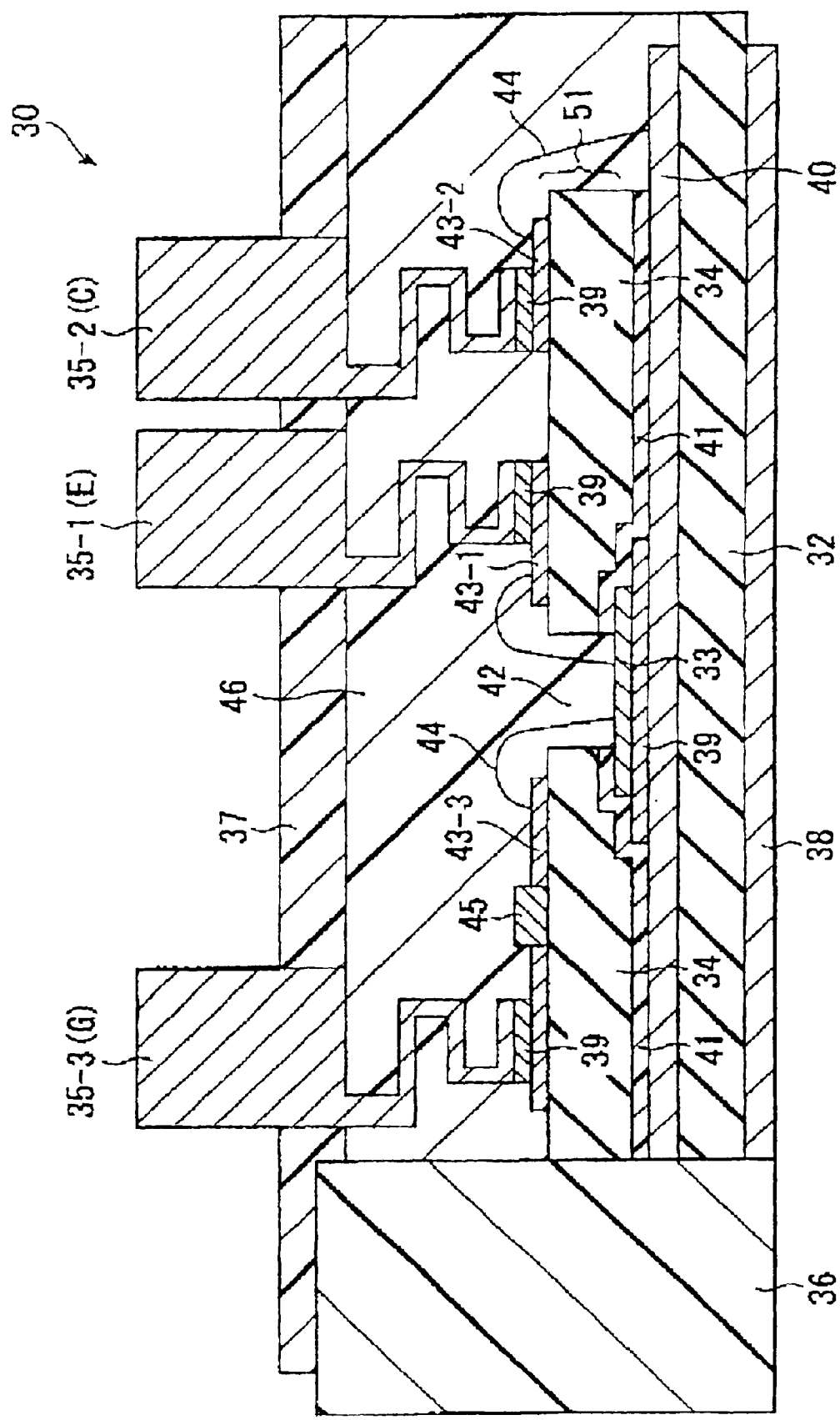
FIG. 5 is a cross-sectional view of an IGBT module according to a modification of the first embodiment of the invention.

FIG. 5 is a cross-sectional view of an IGBT module according to a modification of the first embodiment of the invention.

As is shown in FIG. 5, in this IGBT module 30, the base plate 31 of the IGBT module shown in FIG. 3 is dispensed with. Since sufficient strength of the IGBT module 30 is obtained by the provision of the intermediate wiring element 51, the base plate 31 is not necessary.

Since the base plate is removed, solder bonding in the assembly process is required only when the IGBT chip is mounted on the collector wiring element 40. Thus, the assembly steps can be further simplified, and the manufacturing cost can be reduced. A PCB (Pre-Circuit Board), etc. may be used for the intermediate wiring element 51. If the PCB is used, the IGBT modules according to the first embodiment and the modification thereof can be realized at low cost.

An IGBT module according to a second embodiment of the invention will now be described with reference to FIG.

Figure 6:
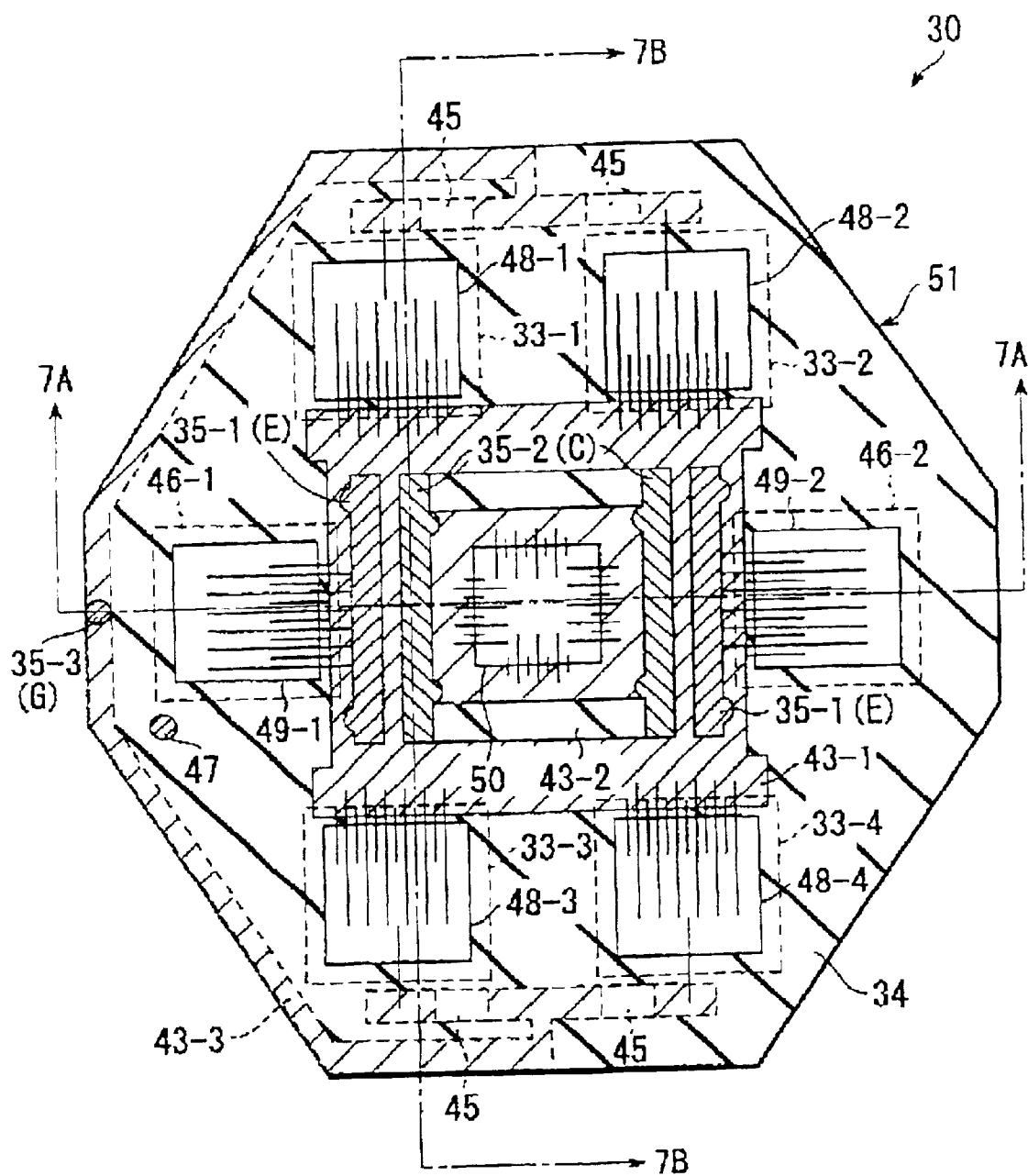
FIG. 6 is a plan view of an IGBT module according to a second embodiment of the invention.
Figure 7A:
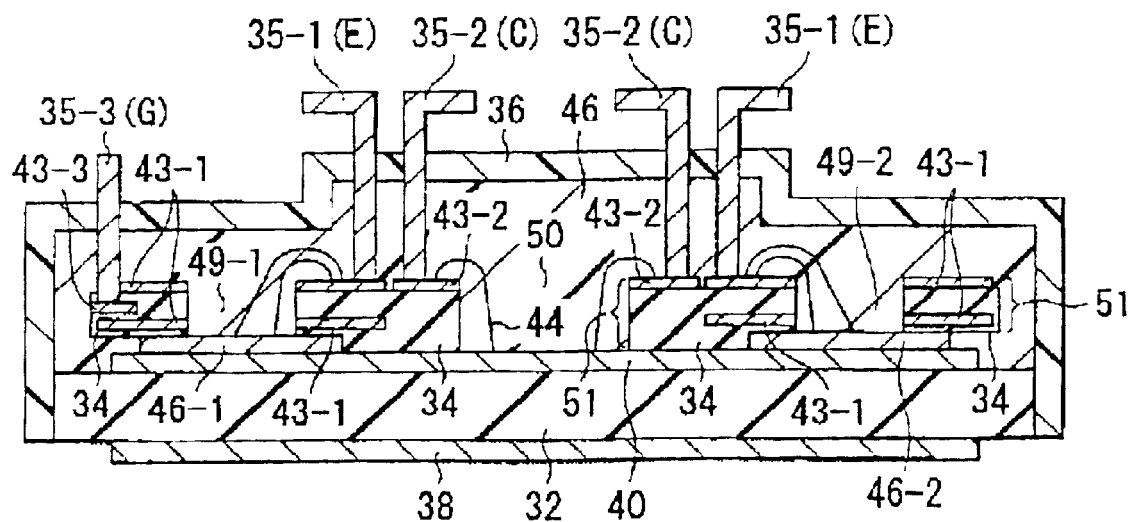
FIGS. 7A and 7B are cross-sectional views taken along lines 7A—7A and 7B—7B in FIG. 6.
Figure 7B:
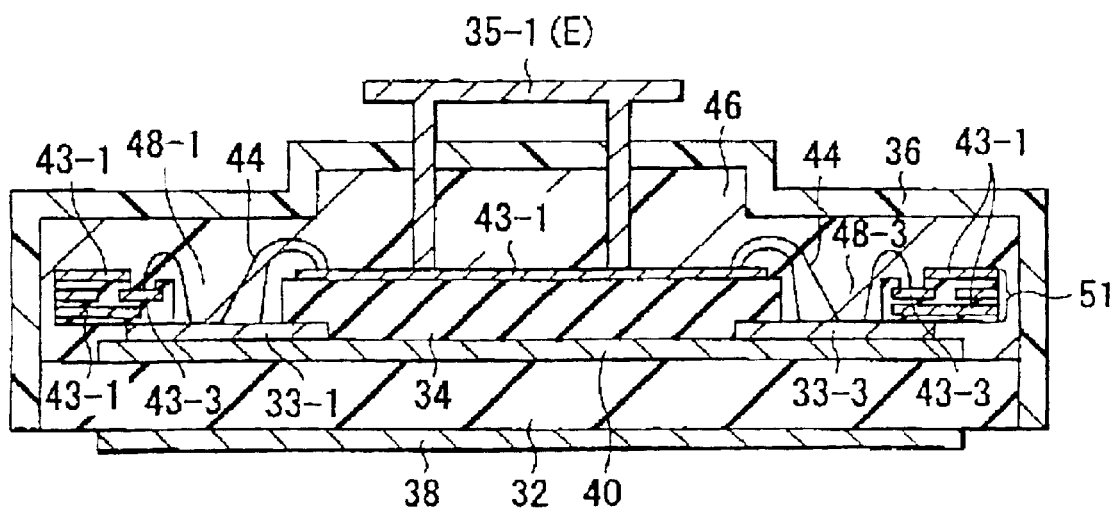
Figure 7C:
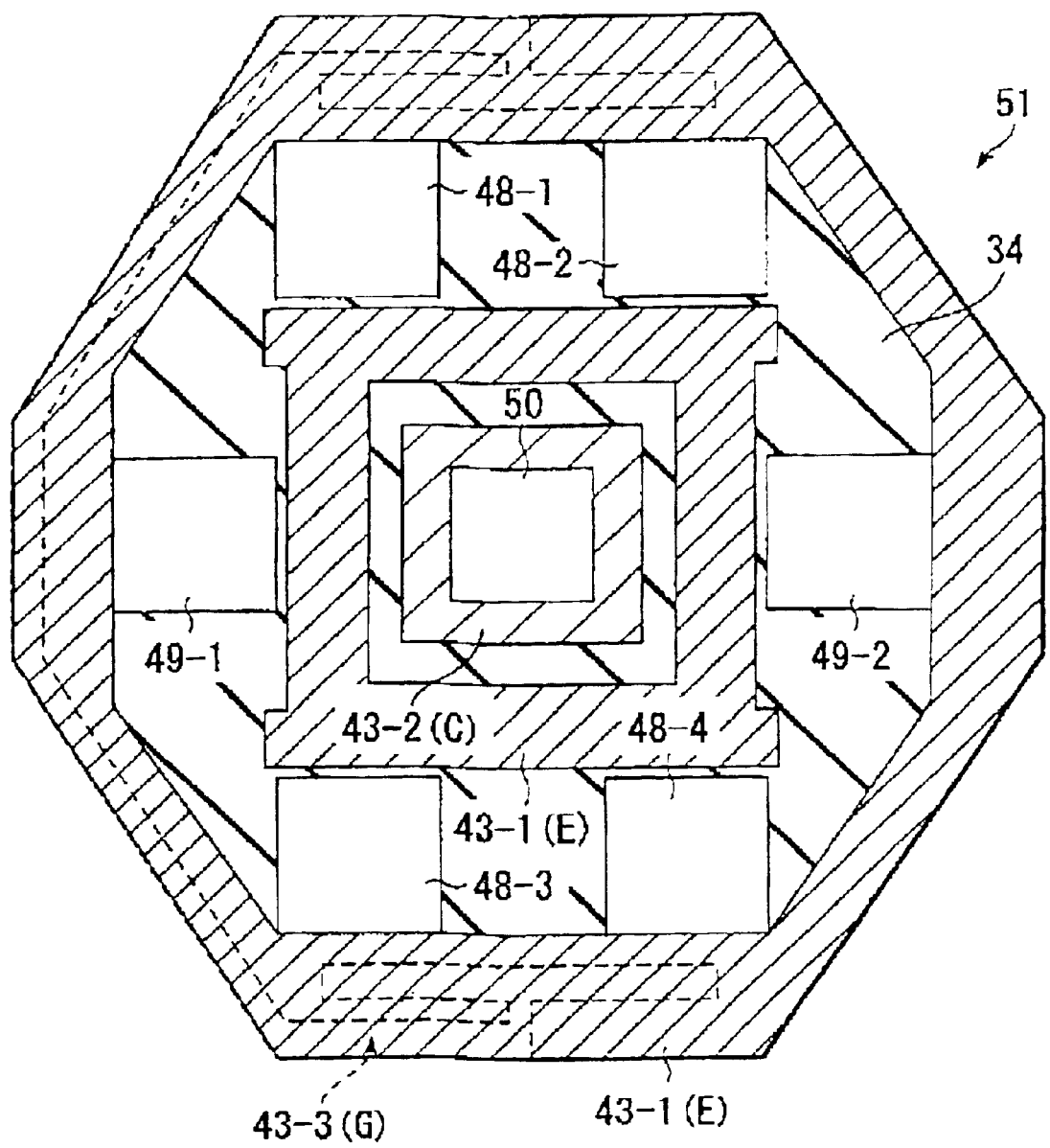
FIG. 7C is a plan view of an intermediate wiring element.

6 and FIGS. 7A to 7C. FIG. 6 is a plan view of the IGBT module. FIG. 7A is a cross-sectional view taken along line 7A—7A in FIG. 6. FIG. 7B is a cross-sectional view taken along line 7B—7B in FIG. 6, and FIG. 7C shows a wiring pattern of wiring elements of an intermediate wiring element.

As is shown in the figures, the IGBT module 30 comprises a ceramic substrate 32, four IGBT chips 33-1 to 33-4, two FRD chips 46-1 and 46-2, an intermediate wiring element 51, emitter/collector/gate terminals 35-1 to 35-3, an emitter sense terminal 47, and a resin case 36.

A copper plate 38 is attached to a back face of the insulative ceramic substrate 32. The copper plate 38 functions as a radiation plate to uniformly conduct heat of the IGBT module 30 to the entirety of the ceramic substrate 32. The ceramic substrate 32 has on its upper surface a copper plate 40 serving as a collector wiring element.

A lower surface (i.e. a semiconductor substrate surface; a collector region formation surface) of each of the IGBT chips 33-1 to 33-4 is attached to the collector wiring element 40. The IGBT chips 33-1 to 33-4 are circumferentially arranged around a central portion of the surface of the ceramic substrate 32. The IGBT chips 33-1 to 33-4 are bonded to the collector wiring element 40 by means of solder (not shown).

The FRD chips 46-1 and 46-2 are fast rectification diodes for flywheels, wherein the lifetime of carriers is controlled by electron beam radiation or proton radiation. A lower surface (i.e. a semiconductor substrate surface; a cathode region formation surface) of each of the FRD chips 46-1 and 46-2 is attached to the collector wiring element 40. Like the IGBT chips 33-1 to 33-4, the FRD chips 46-1 and 46-2 are arranged around the central portion of the surface of the ceramic substrate 32. The FRD chips 46-1 and 46-2, too, are bonded to the collector wiring element 40 by means of solder (not shown).

The intermediate wiring element 51 comprises an insulative member 34 and a wiring portion. The intermediate wiring element 51 is mounted on the collector wiring element 40 so as to substantially cover the entire surface of the ceramic substrate 32. The intermediate wiring element 51 is, for example, a PCB. The intermediate wiring element 51 has openings 48-1 to 48-4 reaching the IGBT chips 33-1 to 33-4 and openings 49-1 and 49-2 reaching the FRD chips 46-1 and 46-2. In addition, the intermediate wiring element 51 has an opening 50 reaching the collector wiring element 40. The openings 48-1 to 48-4, 49-1 and 49-2 expose portions of the surfaces of the chips 33-1 to 33-4, 46-1 and 46-2. In addition, the wiring portion of the intermediate wiring element 51 has a multilayer wiring structure. The multilayer wiring structure includes a first layer and a third layer, as counted from above of the intermediate wiring element 51, which serve as emitter wiring elements 43-1. The first layer also serves as collector wiring elements 43-2, and a second layer serves as a gate wiring element 43-3. At least edge portions of the IGBT chips 33-1 to 33-4 are covered with the intermediate wiring element 51.

FIG. 7C is a plan view of the intermediate wiring element 51, and shows, in particular, a plan-view pattern of the emitter/collector/gate wiring elements 43-1 to 43-3 of the intermediate wiring element 51.

As is shown in FIG. 7C, the collector wiring element 43-2 is provided at a peripheral region of the opening 50 so as to surround the opening 50. The emitter wiring element 43-1 is provided at a region between the openings 48-1 to 48-4, 49-1 and 49-2 and the opening 50 so as to surround the collector wiring element 43-2. The emitter wiring element 43-1 is also provided along the outer periphery of the insulative member 34. Although the emitter wiring element 43-1 provided at this region has a potential equal to the potential of the emitter regions of the IGBT chips 33-1 to 33-4, this emitter wiring element 43-1 does not constitute output current paths of the IGBT chips 33-1 to 33-4. Needless to say, the collector wiring element 43-2 and emitter wiring element 43-1 are separated to ensure isolation. The gate wiring element 43-3 is formed using the second layer, as counted from above of the intermediate wiring element 51. The gate wiring element 43-3 is provided along the outer periphery of the intermediate wiring element 51.

The emitter/gate regions formed on the surfaces of the IGBT chips 33-1 to 33-4 are connected to the emitter/gate wiring elements 43-1 and 43-3 via the openings 48-1 to 48-4 by means of bonding wires 44. The collector wiring element 40 is connected to the collector wiring element 43-2 via the opening 50 by means of bonding wires 44. In addition, anode regions formed on the surfaces of the FRD chips 46-1 and 46-2 are connected to the emitter wiring element 43-1 via the openings 49-1 and 49-2 by means of bonding wires 44. Gate resistors 45 are provided on the gate wiring element 43-3.

Emitter/collector terminals 35-1 and 35-2 are provided on the emitter/collector wiring elements 43-1 and 43-2. Both are bonded by solder (not shown). The gate terminal 35-3 is bonded by solder to a substantially middle point of the gate wiring element 43-3.

In addition, the emitter sense terminal 47 is provided on the intermediate wiring element 51. The emitter sense terminal 47 is a terminal for taking out an emitter current. In the case of the large-capacity IGBT module, a large current is output from the emitter terminal 35-1. If a current is directly taken out of the emitter terminal 35-1 in order to detect the emitter potential, a considerable voltage drop occurs at the current take-out portion. For this reason, the emitter potential is not directly taken out of the emitter terminal 35-1, but is taken out of the emitter sense terminal 47 that does not constitute the emitter current path. The gate potential is set with reference to the emitter potential taken out of the emitter sense terminal 47.

The above-described structure is sealed in the resin case 36. The resin case 36 is filled with resin 46.

The IGBT module with the above structure has the following advantages:

(1) Assembly steps of the IGBT module are simplified, (2) The degree of freedom of layout in plan of the IGBT module is enhanced, (3) The breakdown voltage of the IGBT module is increased, (4) The parasitic inductance of the IGBT module can easily be made uniform, and (5) The thermal resistance of the IGBT module can be suppressed.

The advantages (1) to (3) were explained in connection with the first embodiment, and an explanation thereof is omitted here. The advantages (4) and (5) will now be described.

Figure 2A:
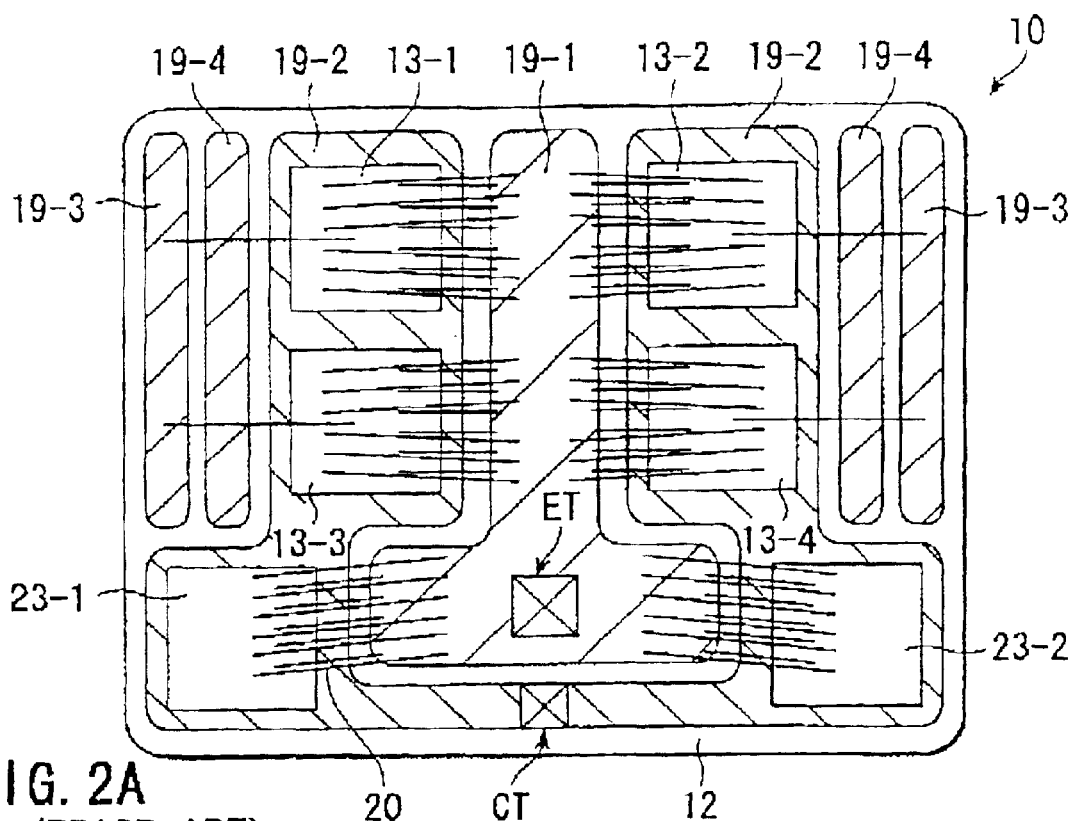
FIGS. 2A and 2B are plan views of prior-art IGBT modules.
Figure 2B:
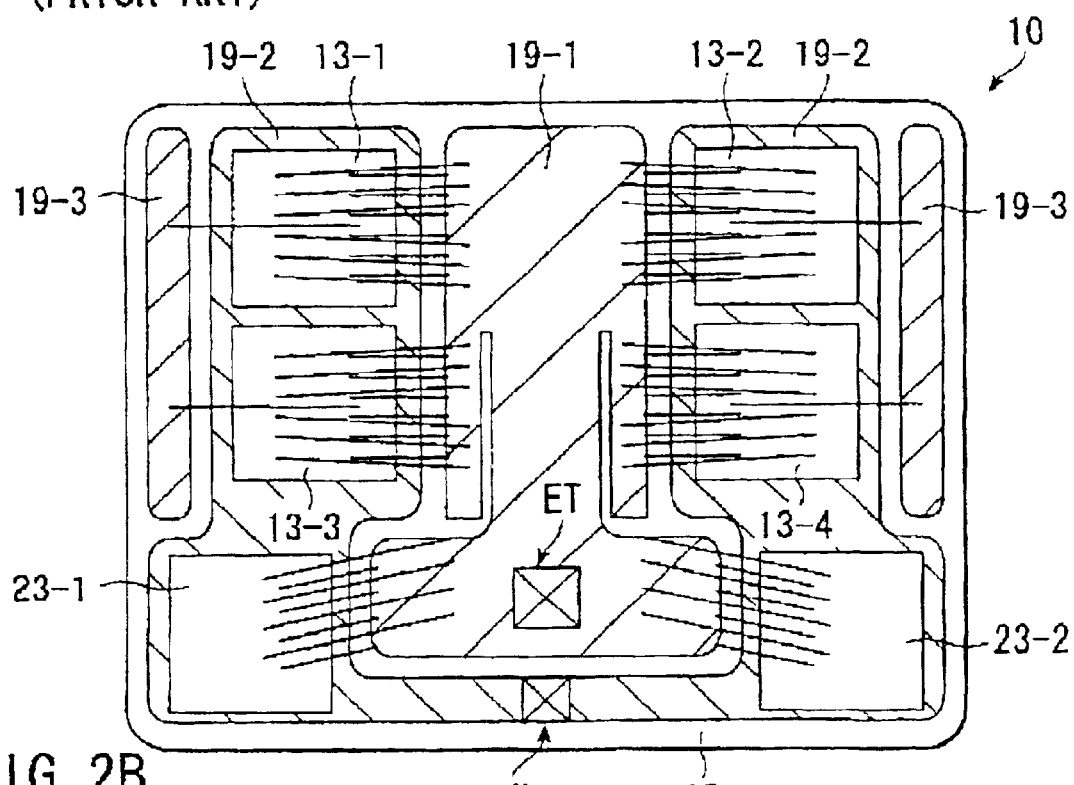

The IGBT module with the prior-art structure has a low degree of freedom of layout of the IGBT chip. Consequently, where plural IGBT chips are mounted, different current paths are formed between the respective IGBT chips and the respective terminals (see FIG. 2A). Accordingly, the parasitic inductance that is parasitically present in each current path varies from IGBT chip to IGBT chip. As a result, non-uniformity occurs, for example, in timing of switching operations, and oscillation may occur. Since the degree of freedom of layout of the IGBT chip is low, it is very difficult to maintain insulation between wiring elements and to make uniform the parasitic inductance between the IGBT chips (see FIG. 2B). Moreover, with an increase in capacity of the IGBT module, the size of the IGBT chip has also increased. The amount of heat produced from each IGBT chip increases accordingly. In this case, with the prior-art structure that permits only a low degree of freedom of layout of IGBT chips, the distance between adjacent IGBT chips cannot be maintained. This leads to thermal interference due to heat produced by the respective IGBT chips. As a result, thermal resistance increases, and the amount of heat produced by the IGBT module and the power consumption of the IGBT module increase.

In the IGBT module of this embodiment, however, the intermediate wiring element 51 is used and the degree of freedom of layout of IGBT chips is greatly increased, compared to the prior art. It is thus very easy to maintain insulation between the wiring elements and to uniformize the parasitic inductance between IGBT chips. If the current paths are made uniform, the wiring resistance is also made uniform between IGBT chips. Moreover, an adequate distance can be maintained between adjacent IGBT chips. Thus, thermal interference due to heat produced by the respective IGBT chips can be prevented. It is possible to reduce the thermal resistance of the IGBT module and to decrease the amount of produced heat and the power consumption. Since these advantages are obtained, the electrical characteristics of the IGBT module can be improved. If the PCB having multilayer wiring is used as the intermediate wiring element 51, the gate wiring element 43-3 and emitter wiring element 43-1 overlap each other. This structure, too, contributes to reduction of the parasitic inductance.

Figure 9:
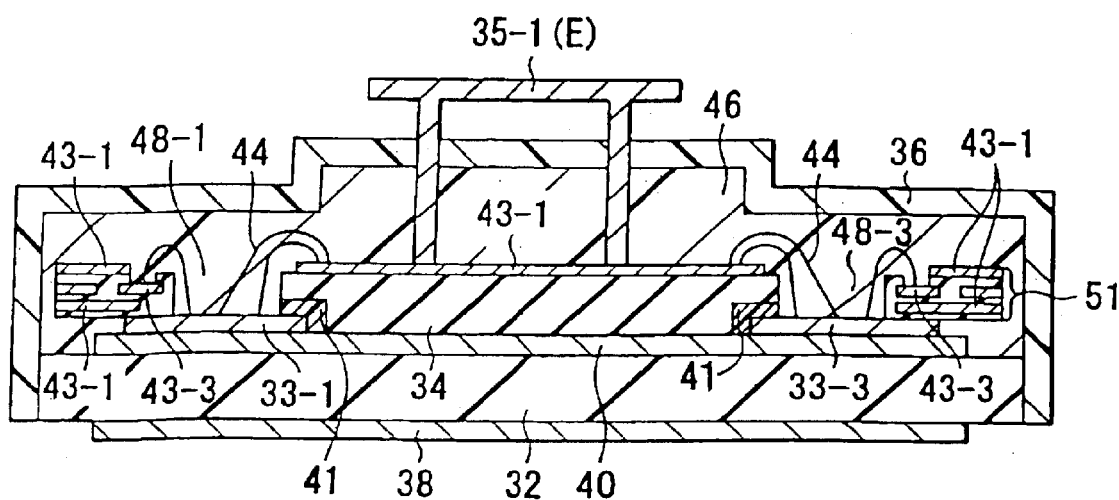
FIG. 9 is a cross-sectional view of an IGBT module according to an alternative embodiment of the present invention.

Additionally, like the first embodiment, a high-insulation resin may be provided between the intermediate wiring element 51 and the IGBT Qhips 33-1 to 33-4, as illustrated in FIG. 9. In this case, the breakdown voltage of the IGBT module 30 can be further increased.

The layout of the IGBT chips 33-1 to 33-4 and FRD chips 46-1 and 46-2 on the ceramic substrate 32 is not limited to that shown in FIG. 6. The layout may be freely chosen if the wiring resistance and parasitic inductance can be reduced to negligible levels. In the described embodiment, the IGBT module comprises IGBT chips and FRD chips. However, needless to say, the present invention is applicable to the case where an IGBT module is fabricated in combination with other power devices such as power MOS transistors.

Figure 8:
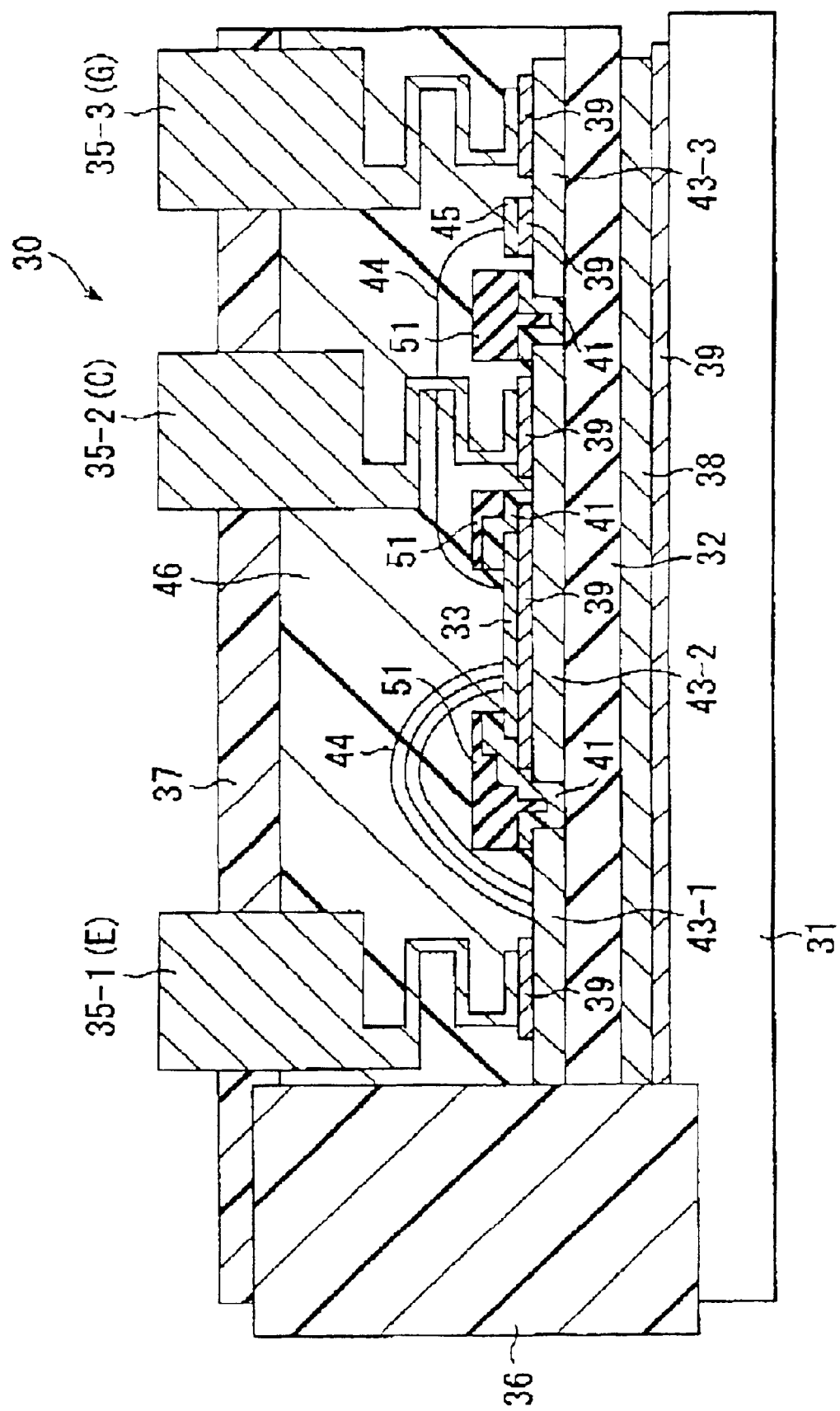
FIG. 8 is a cross-sectional view of an IGBT module according to a third embodiment of the invention.

An IGBT module according to a third embodiment of the invention will now be described with reference to FIG. 8. FIG. 8 is a cross-sectional view of the IGBT module.

This embodiment is applicable to a case where an improvement in the layout in plan is not considered, and only the breakdown voltage of the IGBT module is to is be increased. In this embodiment, intermediate wiring elements are used merely as insulating members. The intermediate wiring elements are provided only at locations that require insulation. As is mentioned above, important locations for maintaining insulation are adjacent portions of the wiring elements and edge portions of IGBT chips at which electric fields concentrate. As is shown in FIG. 8, intermediate wiring elements 51 are provided at these locations and are bonded by high-insulation resins 41.

According to this structure, the portions that may directly cause a decrease in breakdown voltage are insulated by the intermediate wiring elements 51 and high-insulation resins 41. The other portions are insulated by low-insulation resins 46 such as silicone gel. Accordingly, thermal stress occurring in bonding wires 44 can be decreased, and the breakdown voltage of the IGBT module can be increased.

As has been described above, the first to third embodiments of the invention can provide semiconductor devices capable of improving the degree of freedom of layout in plan and the breakdown voltage. In the first to third embodiments, wires are used for bonding between the IGBT chips and wiring elements, bonding between the FRD chips and wiring elements, and bonding between wiring elements. Alternatively, lead frames, etc. may be used for the bonding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulative substrate having a first wiring element on a surface thereof;
   a semiconductor chip provided on the first wiring element;
   an insulative resin provided on the first wiring element and covering at least edge portions of the semiconductor chip, and
   an insulative sealing member, provided on the insulative substrate, covering the semiconductor chip and the insulative resin, said sealing member having lower insulation and higher softness properties than a region of said insulative resin, which is in contact with the semiconductor chip and the first wiring element.

2. The semiconductor device according to claim 1, further comprising an intermediate wiring element provided on the insulative resin, said intermediate wiring element being formed on the semiconductor chip and the first wiring element with the insulative resin therebetween, said intermediate wiring element having wiring portions electrically connected to a surface region of the semiconductor chip and to the first wiring element.

3. The semiconductor device according to claim 2, further comprising external connection terminals provided on the wiring portions.

4. The semiconductor device according to claim 2, wherein the wiring portions are electrically connected to gate, source and drain regions of the semiconductor chip.

5. A semiconductor device comprising:
   an insulative substrate having a first wiring element on a surface thereof;
   a semiconductor chip provided on the first wiring element;
   an insulative member provided on the first wiring element and covering at least edge portions of the semiconductor chip;
   second wiring elements provided on and/or in the insulative member, said second wiring elements being electrically connected to a surface region of the semiconductor chip and to the first wiring element; and
   an insulative sealing member, provided on the insulative substrate, covering the semiconductor chip and the insulative member, said sealing member having lower insulation and higher softness properties than a region of said insulative member which is in contact with the semiconductor chip and the first wiring element.

6. The semiconductor device according to claim 5, further comprising external connection terminals provided on the second wiring elements.

7. A semiconductor device comprising:
- an insulative substrate having a wiring element on a surface thereof;
- a semiconductor chip provided on the wiring element;
- an insulative member provided on the wiring element and covering at least edge portions of the semiconductor chip;
- wiring layers formed on the insulative member and electrically connected to a surface region of the semiconductor chip and the wiring element; and
- an insulative sealing member, provided on the insulative substrate, covering the semiconductor chip and the wiring layer.

8. The semiconductor device according to claim 7, wherein a region of the insulative member, which is in contact with the semiconductor chip and the wiring element, has higher insulation properties than the sealing member.

9. The semiconductor device according to claim 7, further comprising an insulative resin lying between the insulative member and the semiconductor chip and between the insulative member and the wiring element.

10. The semiconductor device according to claim 7, further comprising external connection terminals provided on the wiring layers.

11. The semiconductor device according to claim 7, wherein the wiring layers are electrically connected to gate, source and drain regions of the semiconductor chip.

12. A semiconductor device comprising:
- an insulative substrate having a wiring element on a surface thereof;
- semiconductor chips provided on the wiring element;
- an insulative member provided on the wiring element and covering the semiconductor chips, said insulative member having first openings and a second opening, said first openings exposing, at their bottom portions, parts of surfaces of the semiconductor chips, said second opening exposing at its bottom portion a part of the wiring element, said insulative member covering at least edge portions of the semiconductor chips;
- wiring layers formed on the insulative member and electrically connected to surface regions of the semiconductor chips, which are exposed to the first openings and to the wiring element which is exposed to the second opening;
- external connection terminals provided on the wiring layers, said external connection terminals including input terminals receiving signals and output terminals outputting signals, said wiring layers being formed such that current paths between the input terminals and the output terminals via the semiconductor chips are substantially equal; and
- an insulative sealing member, provided on the insulative substrate, covering the semiconductor chips and the insulative member.

13. The semiconductor device according to claim 12, wherein the semiconductor chips are arranged in a circumferential fashion in a plane of the insulative substrate; and
said second opening is provided at a substantially central portion of said circumference.

14. The semiconductor device according to claim 13, wherein regions of the insulative member, which are in contact with the semiconductor chips and the wiring element, have higher insulation properties than the sealing member.

15. The semiconductor device according to claim 13, further comprising an insulative resin lying between the insulative member and the semiconductor chips, said insulative resin having higher insulation properties than the sealing member.

16. The semiconductor device according to claim 13, further comprising external connection terminals provided on the wiring layers.

* * * * *